US009054101B2

(12) United States Patent
Semmelmeyer et al.

(10) Patent No.: US 9,054,101 B2
(45) Date of Patent: Jun. 9, 2015

(54) MULTI-DIMENSIONAL INTEGRATED CIRCUIT STRUCTURES AND METHODS OF FORMING THE SAME

(71) Applicant: Taiwan Semiconductor Manufacturing Company, Ltd., Hsin-Chu (TW)

(72) Inventors: Mark Semmelmeyer, Sunnyvale, CA (US); Sandeep Kumar Goel, San Jose, CA (US)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/169,799

(22) Filed: Jan. 31, 2014

(65) Prior Publication Data

US 2014/0147972 A1    May 29, 2014

Related U.S. Application Data

(62) Division of application No. 13/354,967, filed on Jan. 20, 2012, now Pat. No. 8,686,570.

(51) Int. Cl.
*H01L 21/44* (2006.01)
*H01L 25/00* (2006.01)
(Continued)

(52) U.S. Cl.
CPC ............ *H01L 25/50* (2013.01); *H01L 23/3128* (2013.01); *H01L 21/561* (2013.01); *H01L 2224/14181* (2013.01); *H01L 2224/16225* (2013.01); *H01L 2225/06517* (2013.01); *H01L 2924/15311* (2013.01); *H01L 2225/06572* (2013.01); *H01L 25/0652* (2013.01); *H01L 2224/48145* (2013.01); *H01L 2224/73257* (2013.01); *H01L 2225/06506* (2013.01); *H01L 22/22* (2013.01); *H01L 24/14* (2013.01); *H01L 24/16* (2013.01); *H01L 24/32* (2013.01); *H01L 24/48* (2013.01); *H01L 24/73* (2013.01); *H01L 24/81* (2013.01); *H01L 24/92* (2013.01); *H01L 24/97* (2013.01); *H01L 2224/0401* (2013.01);
(Continued)

(58) Field of Classification Search
CPC ............... H01L 2924/00; H01L 2924/00014; H01L 2224/73265; H01L 2224/32225; H01L 2224/48227
USPC ............. 438/106, 109; 257/E21.499, E23.01, 257/E23.141
See application file for complete search history.

(56) References Cited

U.S. PATENT DOCUMENTS 7,247,932 B1 *   7/2007   Lin et al. ............... 257/686
7,327,038 B2 *   2/2008   Kwon et al. ........... 257/777
(Continued)

OTHER PUBLICATIONS

"Next Generation Package Substrates: 3D silicon and glass Interposers Technologies, applications and markets," Report sample, Aug. 2010, 20 pages, Yole Développement.

*Primary Examiner* — Andy Huynh
(74) *Attorney, Agent, or Firm* — Slater & Matsil, L.L.P

(57) ABSTRACT

An embodiment is method comprising attaching a first die and a second die to a first surface of a first interposer using respective ones of first conductive connectors coupled to respective first surfaces of the first die and the second die; attaching a third die and a fourth die to a second surface of the first interposer using respective ones of second conductive connectors, the second surface of the first interposer being opposite the first surface of the interposer; and attaching the first die and the second die to a substrate using respective ones of third conductive connectors coupled to respective second surfaces of the first die and the second die.

19 Claims, 17 Drawing Sheets

(51) Int. Cl.
*H01L 25/065* (2006.01)
*H01L 23/31* (2006.01)
*H01L 21/56* (2006.01)
*H01L 21/66* (2006.01)
*H01L 23/00* (2006.01)
*H01L 23/538* (2006.01)

(52) U.S. Cl.
CPC ............... *H01L 2224/04042* (2013.01); *H01L 2224/05009* (2013.01); *H01L 2224/13025* (2013.01); *H01L 2224/1403* (2013.01); *H01L 2224/32225* (2013.01); *H01L 2224/48227* (2013.01); *H01L 2224/4824* (2013.01); *H01L 2224/73204* (2013.01); *H01L 2224/73207* (2013.01); *H01L 2224/81005* (2013.01); *H01L 2224/81815* (2013.01); *H01L 2224/92125* (2013.01); *H01L 2224/97* (2013.01); *H01L 2225/0651* (2013.01); *H01L 2924/157* (2013.01); *H01L 2225/06541* (2013.01); *H01L 2225/06548* (2013.01); *H01L 2924/00014* (2013.01); *H01L 23/5384* (2013.01); *H01L 23/5385* (2013.01); *H01L 2924/1461* (2013.01)

(56) References Cited

U.S. PATENT DOCUMENTS

| | | | |
|---|---|---|---|
| 8,533,549 B2* | 9/2013 | Kondo et al. | 714/733 |
| 2001/0046129 A1 | 11/2001 | Broglia | |
| 2005/0102468 A1* | 5/2005 | Delaney et al. | 711/114 |
| 2006/0043585 A1 | 3/2006 | Sukegawa | |
| 2007/0090534 A1 | 4/2007 | Iwasaki | |
| 2013/0127028 A1* | 5/2013 | Morimoto et al. | 257/666 |

* cited by examiner

US 9,054,101 B2

MULTI-DIMENSIONAL INTEGRATED CIRCUIT STRUCTURES AND METHODS OF FORMING THE SAME

This application is a divisional of U.S. patent application Ser. No. 13/354,967, filed on Jan. 20, 2012, entitled "Multi-Dimensional Integrated Circuit Structures and Methods of Forming the Same," which application is hereby incorporated herein by reference in its entirety.

BACKGROUND

Since the invention of integrated circuits, the semiconductor industry has experienced continuous rapid growth due to constant improvements in the integration density of various electronic components (i.e., transistors, diodes, resistors, capacitors, etc.). For the most part, these improvements in integration density have come from repeated reductions in minimum feature size, allowing more components to be integrated into a given chip area.

These integration improvements are essentially two-dimensional (2D) in nature, in that the volume occupied by the integrated components is essentially on the surface of the semiconductor wafer. Although dramatic improvements in lithography have resulted in considerable improvements in 2D integrated circuit formation, there are physical limitations to the density that can be achieved in two dimensions. One of these limitations is the minimum feature size needed to make these components. Also, when more devices are put into one chip, more complex designs are required. An additional limitation comes from the significant increase in the number and length of interconnections between devices as the number of devices increases. When the number and length of interconnections increase, both circuit RC delay and power consumption increase.

Three-dimensional integrated circuits (3DICs) were thus formed, wherein at least two dies may be stacked, with through-substrate vias (TSVs) formed in one of the dies to connect the other die to a package substrate. These 3DICs generally incurred problems. For example, the connectivity of a die, such as a top die, to another component required a dependency on the design of other dies intervening between the die and the other component. Also, the stack height is generally limited by a yield requirement. Typically, as the stack height increases by the addition of dies, the yield decreases because a fault in any die would render the entire structure faulty, and an increased number of dies increases the probability that any one of the dies will fail. Further, a bottom die generally is a thermal and current "hot spot" in the stack because during the normal operation of the dies, a relatively large current flowing through the bottom die to top dies from a power source, and because there is a large distance to a package heat sink above the topmost die. Next, these structures may have a footprint that is too small to contain all Controlled Collapse Chip Connection ("C4") bumps or solder balls that are required for various applications.

Also, the semiconductor industry has formed what are known as two and one half-dimensional integrated circuits (2.5DICs), wherein at least two dies may be connected to an interposer, which is in turn connected to a package substrate. These structures may be limited by an interposer size, which is limited by a reticle, a yield, and a package requirement. Also, the footprint may be too big for some products. Further, wire lengths and power consumption are not reduced compared to monolithic devices. A hot spot may occur in the center of the interposer due to global routing of electrical signals.

BRIEF DESCRIPTION OF THE DRAWINGS

For a more complete understanding of the present embodiments, and the advantages thereof, reference is now made to the following descriptions taken in conjunction with the accompanying drawings, in which.

DETAILED DESCRIPTION OF ILLUSTRATIVE EMBODIMENTS

The making and using of the present embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosed subject matter, and do not limit the scope of the different embodiments.

A novel three-dimensional integrated circuit (3DIC) structure and the method of forming the same are provided. Embodiments of a 3DIC are suited for use in various applications, including field programmable gate arrays (FPGAs), system on chips (SoCs), graphics processing units (GPUs), and/or the like, all with or without memory dies included in the 3DIC. It should be noted that although discussed in the context of a 3DIC structure, other embodiments contemplate a two and one-half dimensional IC (2.5DIC) structure. Embodiments and the intermediate stages of manufacturing an embodiment are illustrated. Some variations of embodiments are discussed, and additional variations will be readily apparent to a person having ordinary skill in the art. Throughout the various views and illustrative embodiments, like reference numbers are used to designate like elements.

Figure 1A:
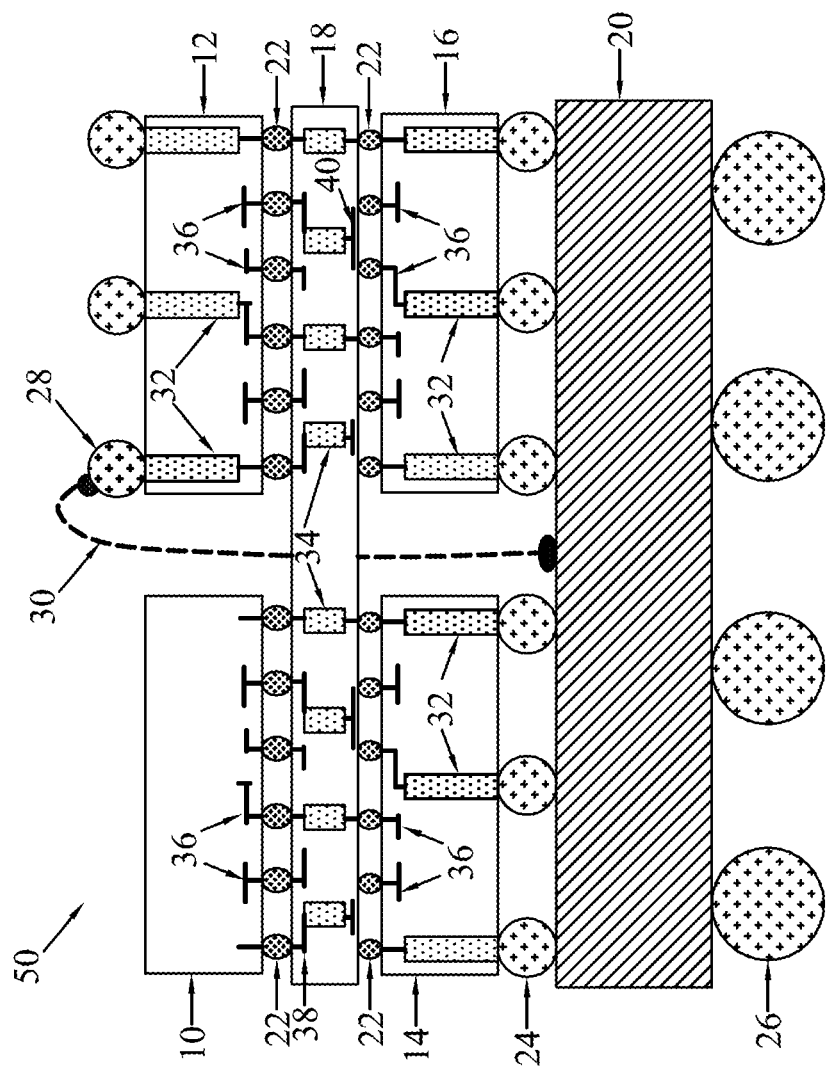
FIG. 1A is a cross-section view of a four-die 3DIC structure according to an embodiment.

With reference now to FIG. 1A, there is shown a cross-section view of a four-die 3DIC structure 50 according to an embodiment. The 3DIC structure 50 includes a first die 10 and a second die 12 (collectively "second level dies 10/12"), an interposer 18, a third die 14 and a fourth die 16 (collectively "first level dies 14/16"), and a substrate 20. The second level dies 10/12 each have a first surface, such as an active surface, electrically, communicatively, and/or mechanically coupled to a first surface, such as a top surface, of the interposer 18 by respective first connectors 22, for example, conductive micro-bumps. Similarly, the first level dies 14/16 each have a first surface, such as an active surface, electrically, communicatively, and/or mechanically coupled to a second surface, such as a bottom surface, of the interposer 18 by respective first connectors 22. The first level dies 14/16 each have a second surface, such as a backside surface, electrically, communicatively, and/or mechanically coupled to a first surface, such as a top surface, of the substrate 20 by second connectors 24, for example, Controlled Collapse Chip Connection ("C4") bumps. A second surface, such as a bottom surface, of the substrate 20 has third connectors 26, such as Ball Grid Array ("BGA") balls. The substrate 20 is, for example, a package laminate substrate.

The first die 10 includes interconnects 36 that electrically couple active and/or passive devices in, on, and/or over the die substrate to external components. The interconnects 36 may be a combination of patterns in various metallization layers and vias between respective patterns. The respective first connectors 22 are directly or indirectly coupled to the interconnects 36. For example, connector pads may be on the first surface of the first die 10 to which the first connectors 22 are connected.

The second die 12 also includes interconnects 36 that electrically couple active and/or passive devices in, on, and/or over the die substrate and further includes through substrate vias ("TSVs") 32 (also known as "through semiconductor vias" or "through silicon vias"). The respective first connectors 22 are directly or indirectly coupled to the interconnects 36. The TSVs 32 extend from a second surface, for example, a backside surface, opposite the first surface of the second die 12 to the interconnects 36. Fourth connectors 28, such as C4 bumps, are coupled, directly or indirectly, to respective TSVs 32 of the second die 12. A bond wire 30 is connected to one of the fourth connectors 28 and to the substrate 20. A bond wire may be connected to others of the fourth connectors 28 and to the substrate 20, although not specifically depicted in FIG. 1A.

Figure 1B:
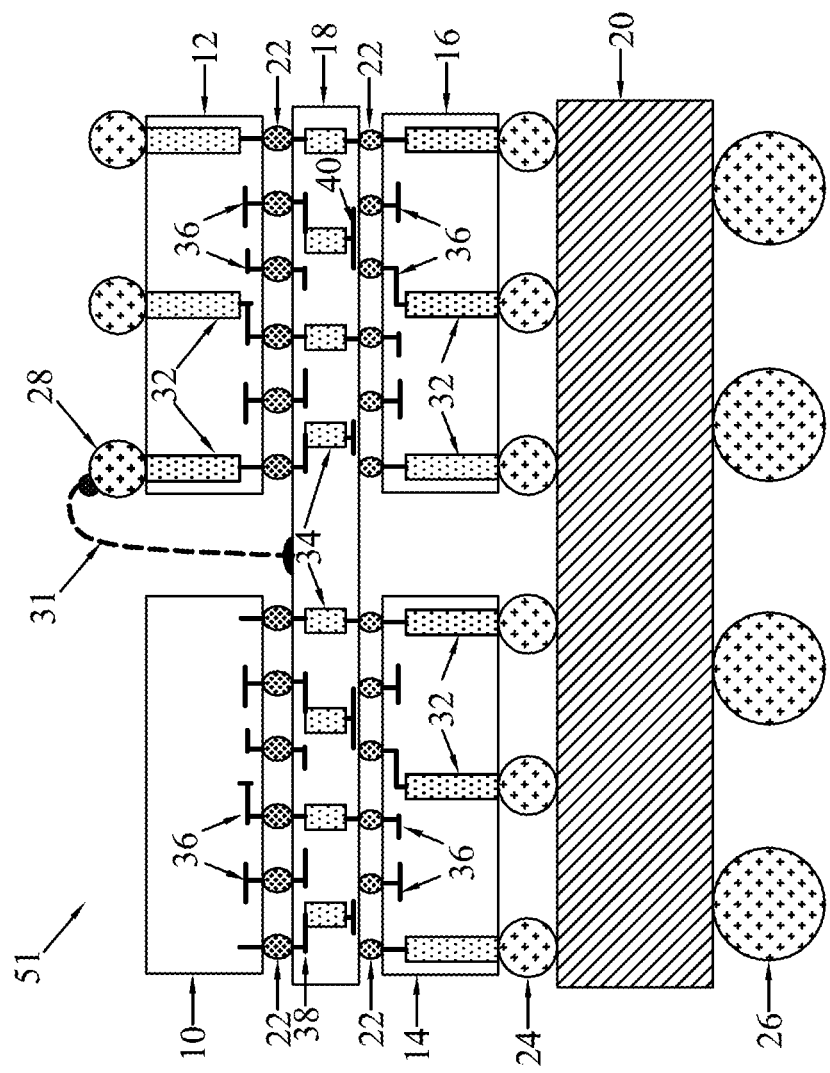
FIG. 1B is a cross-section view of a four-die 3DIC structure according to an embodiment.

In another embodiment of a 3DIC structure 51 in FIG. 1B, a bond wire 31 is connected to the fourth connectors 28 and to the first surface of the interposer 18. In this embodiment, the area of the first surface of the interposer 18 is greater than the combined areas of the first surfaces of the first die 10 and the second die 12 to allow for an area for the bond wire connection to the interposer 18.

FIGS. 1A and 1B (collectively "FIG. 1") illustrate an aspect of various embodiments in that top level dies may or may not have TSVs and bond wires connected thereto. In FIG. 1, the first die 10 has neither TSVs nor bond wires, but the second die 12 does have TSVs 32 and a bond wire 30 or 31. It should be noted that both dies could have TSVs and bond wires, or neither die could have TSVs and bond wires. TSVs and bond wires, as depicted, may allow for further connectivity to the substrate 20 and/or interposer 18. Although not specifically depicted in the following figures, the dies in each figure may have bond wires connected thereto and to various components in the structure.

Referring back to FIG. 1A, the interposer 18 includes TSVs 34, first side interconnect components 38, which include any number of metallization layers and vias in any number of dielectric layers, and second side interconnect components 40, which also include any number of metallization layers and vias in any number of dielectric layers. In this embodiment, the interposer 18 may be said to be in a mezzanine level between the first level dies 14/16 and the second level dies 10/12. First connectors 22 on the first side of the interposer 18 are electrically coupled to respective first connectors 22 on the second side of the interposer 18 through the first side interconnect components 38, the TSVs 34, and the second side interconnect components 40. It is worth noting that although interconnect components are depicted in FIG. 1, the interposer may not include interconnect components in other embodiments. For example, each of the first connectors 22 may be directly coupled to a connector pad which is in turn directly coupled to a TSV 34. Also, only one side may have interconnect components in further embodiments.

The first level dies 14/16 also include interconnects 36 that electrically couple active and/or passive devices in, on, and/or over the respective die substrates and further include TSVs 32. The respective first connectors 22 are directly or indirectly coupled to the interconnects 36. The TSVs 32 extend from a second surface, for example, a backside surface, opposite the first surface of each of the first level dies 14/16 to the interconnects 36. The second connectors 24 are electrically, communicatively, and/or mechanically coupled, directly or indirectly, to respective TSVs 32 of each of the first level dies 14/16.

Figure 2:
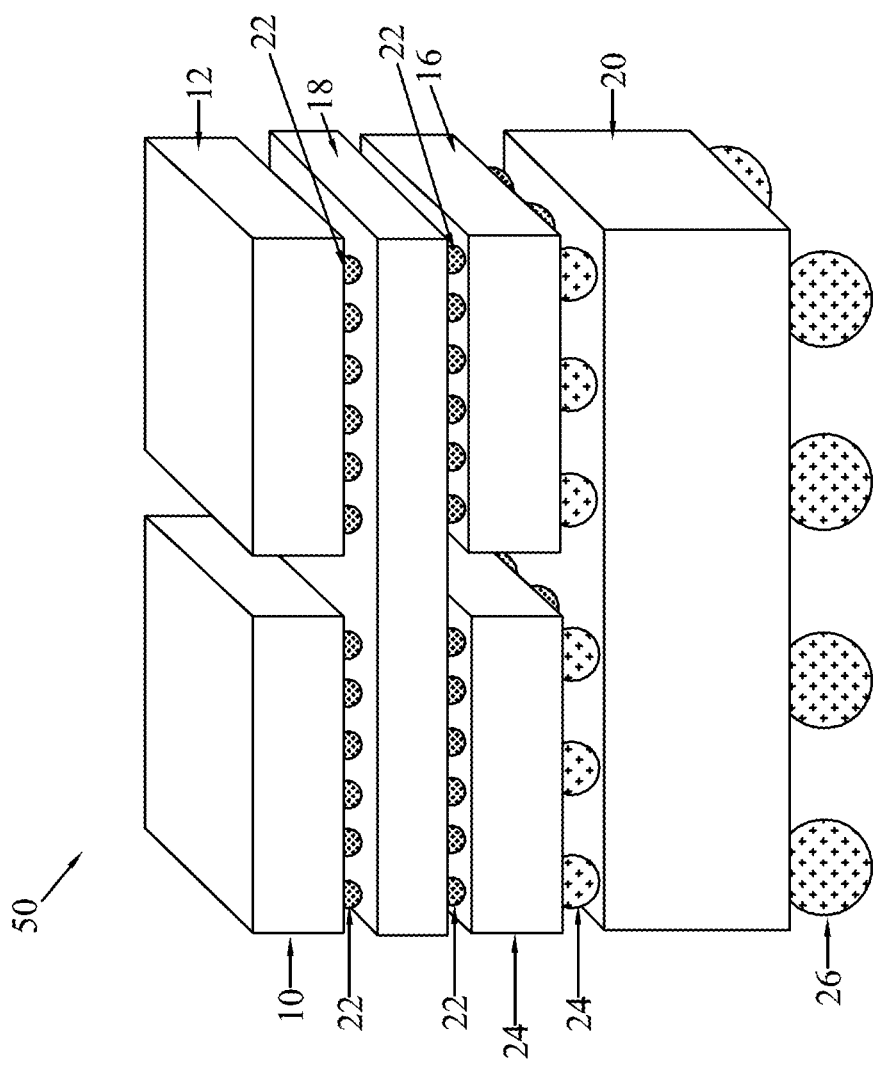
FIG. 2 is a simplified three-dimensional view of the 3DIC structure depicted in cross-section in FIGS. 1A and 1B.

FIG. 2 illustrates a three-dimensional view of the 3DIC structure 50 (subsequent reference to structure 50 also refers to structure 51) depicted in cross-section in FIG. 1. It is worth noting that, as stated above, one or more bond wires may be connected to each of one or more of the dies 10/12, although not specifically illustrated in FIG. 2.

The 3DIC structure 50 of FIGS. 1 and 2 may include further features. In embodiments, the interposer 18 allows for dies to be electrically and/or communicatively coupled together. In further embodiments, the interposer 18 allows for dies to be electrically and/or communicatively coupled together without electrical signals being passed through another die. For example, the first die 10 can be electrically coupled to the fourth die 16 without an electrical signal being passed through either of the second die 12 or the third die 14. First connectors 22 connected to the first die 10 can be coupled to one of the first side interconnect components 38, which is connected to a TSV 34 in the interposer. The TSV 34 can then be connected to one of the second side interconnect components 40, which is connected to a first connector 22 connected to the fourth die 16. One or both of the first side interconnect components 38 and the second side interconnect components 40 may cross the interposer 18, for example, by a conductive line. The second die 12 and the third die 14 may be similarly electrically and/or communicatively coupled. Further, the first die 10 may be electrically and/or communicatively coupled to the third die 14 and the second die 12 may be electrically and/or communicatively coupled to the fourth die 16 in a similar manner without, for example, a conductive line crossing the interposer 18. Also, the second level dies 10/12 may be electrically and/or communicatively coupled together using, for example, a conductive line in the first side interconnect components 38 without using a TSV 34, and similarly, the first level dies 14/16 may be electrically coupled together using, for example, a conductive line in the second side interconnect components 40 without using a TSV 34. Thus, paths between two respective dies may be dedicated paths, and the design of each die may be independent from a required electrical path and associated connectivity between two other dies.

Embodiments further allow for redundancy of dies. In embodiments, one of the dies, for example, the second die 12, is the same as or functionally equivalent to another die, such as the first die 10. Thus, the second die 12 is redundant. For example, signals from the first die 10 and the second die 12 going to another die, such as the third die 14 or fourth die 16, are multiplexed to choose which signal from either the first die 10 or the second die 12 is to be received and processed by the other die. In an embodiment, the multiplexing is performed in the interposer 18, such as when the interposer 18 is an active interposer. For example, the substrate of the interposer 18 is processed to include active circuitry, such as a multiplexor. Other devices in an active interposer may include transistors, diodes, fuses, RLC passives, resonators, and/or micro-electro-mechanical systems (MEMS). The multiplexor receives as inputs signals from the first die 10 and the second die 12. A control signal, such as from the third die 14 or the fourth die 16, is received by the multiplexor to choose which of the signals to pass to another die, such as the third die 14 or the fourth die 16. In another embodiment, the multiplexing is performed by a multiplexor in another die, such as the third die 14 or the fourth die 16.

It is worth noting that the multiplexor may take many different configurations. For example, if there are N number of redundant dies, the multiplexor may be a single N:1 multiplexor, or the multiplexor may be N−1 serial 2:1 multiplexors, where at each control level there is only one multiplexor or where each control level has two multiplexors. In other embodiments, the signals output from the first die 10 and second die 12 are passed through a tri-state buffer to an output of each die. The outputs of the dies can be connected, such as shorted, and the tri-state buffers can be controlled to output the signal from only one of the first die 10 or the second die 12. Embodiments contemplate any configuration for multiplexing.

In these embodiments, for example, a cheaply manufactured die may be duplicated in the 3DIC structure to allow for repair if the die should be faulty. This may prevent the loss of more expensive dies in the 3DIC based on the fault of a cheap die. For example, if the first die 10 is five dollars to process, the second die 12 is the same as or functionally equivalent to the first die 10 (thus, a redundant die), the third die 14 is one hundred dollars to process, and the fourth die 16 is fifty dollars to process, the second die 12 may allow the 3DIC structure to remain functional despite the first die 10 being faulty, thus preventing the loss of the one hundred and fifty dollars processing costs of the third die 14 and the fourth die 16, respectively.

As discussed, a redundant die can be a copy of another die in the 3DIC structure. A copied die can allow for added capacity in the 3DIC structure with each of the original and copy dies retaining functionality during operation of the structure. In some instances, the redundant die may include TSVs and may be on the top level. In those instances, if no connectors are coupled to the TSVs through a backside surface of the redundant die, then a passivation layer or overfill, such as a molding compound applied during packaging, may electrically isolate the TSVs. If connectors are coupled to the TSVs, such as by C4 bumps, an overfill insulation may smother the connectors.

In embodiments where a bond wire is used, a bond wire may supply power to a die. If the die to which the bond wire supplies power is determined to be faulty, the bond wire can be cut to prevent power from being provided to the faulty die, thus saving power. In other embodiments, the die can be either a redundant die or can be an optional product feature which can be disabled by cutting the bond wire. In further embodiments, a bond wire may provide a control signal for multiplexing. The bond wire can be bonded to a constant value to provide the control signal based on the repair analysis for the structure.

Figure 3:
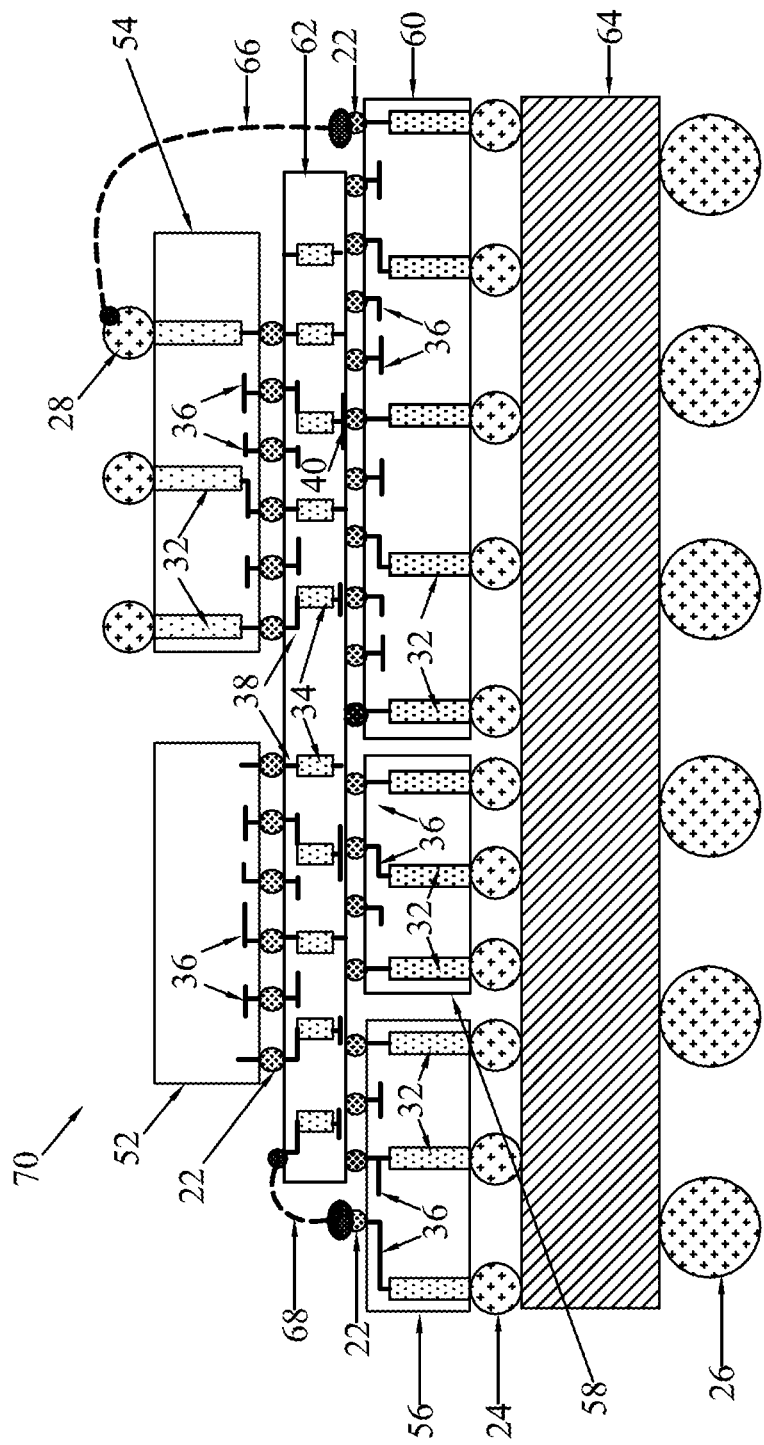
FIG. 3 illustrate a cross-section view of a five-die 3DIC structure according to an embodiment.

FIG. 3 illustrates a cross-section view of a five-die 3DIC structure 70 according to an embodiment. This embodiment illustrates example features of embodiments where asymmetry among layers is contemplated. The 3DIC structure 70 includes a first die 52 and a second die 54 (collectively "second level dies 52/54"); an interposer 62; a third die 56, a fourth die 58, and a fifth die 60 (collectively "first level dies 56/58/60"); and a substrate 64. The second level dies 52/54 each have a first surface, such as an active surface, electrically, communicatively, and/or mechanically coupled to a first surface, such as a top surface, of the interposer 62 by respective first connectors 22. Similarly, the first level dies 56/58/60 each have a first surface, such as an active surface, electrically, communicatively, and/or mechanically coupled to a second surface, such as a bottom surface, of the interposer 62 by respective first connectors 22. The first level dies 56/58/60 each have a second surface, such as a backside surface, electrically, communicatively, and/or mechanically coupled to a first surface, such as a top surface, of the substrate 64 by second connectors 24. A second surface, such as a bottom surface, of the substrate 64 has third connectors 26. FIG. 3 further illustrates components with reference numerals that are described in FIG. 1, and accordingly, explicit description of those components here is omitted for brevity.

In FIG. 3, the first level comprises more dies than the second level, and the dies have different sizes. Further, each of the third die 56 and the fifth die 60 extends from under the interposer 62 such that portions of the respective first surfaces of the third die 56 and the fifth die 60 are not covered by the interposer 62. Also, the interposer 62 has an area that is larger than the combined area of the first surfaces of the second level dies 52/54 such that the interposer 62 has an area that extends from and is not covered by the second level dies 52/54. In this embodiment bond wires 66 and 68 may be used to electrically couple components on various surfaces of various devices. As depicted, bond wire 68 electrically couples a first connector 22 on the first surface of the third die 56 to the first surface of the interposer 62. Also, bond wire 66 electrically couples a first connector 22 on the first surface of the fifth die 60 to the fourth connector 28 on the second die 54. Different shapes, sizes, number, and configurations of dies are contemplated in other embodiments, as are different techniques of electrically coupling various components, such as through a bond wire.

Figure 4:
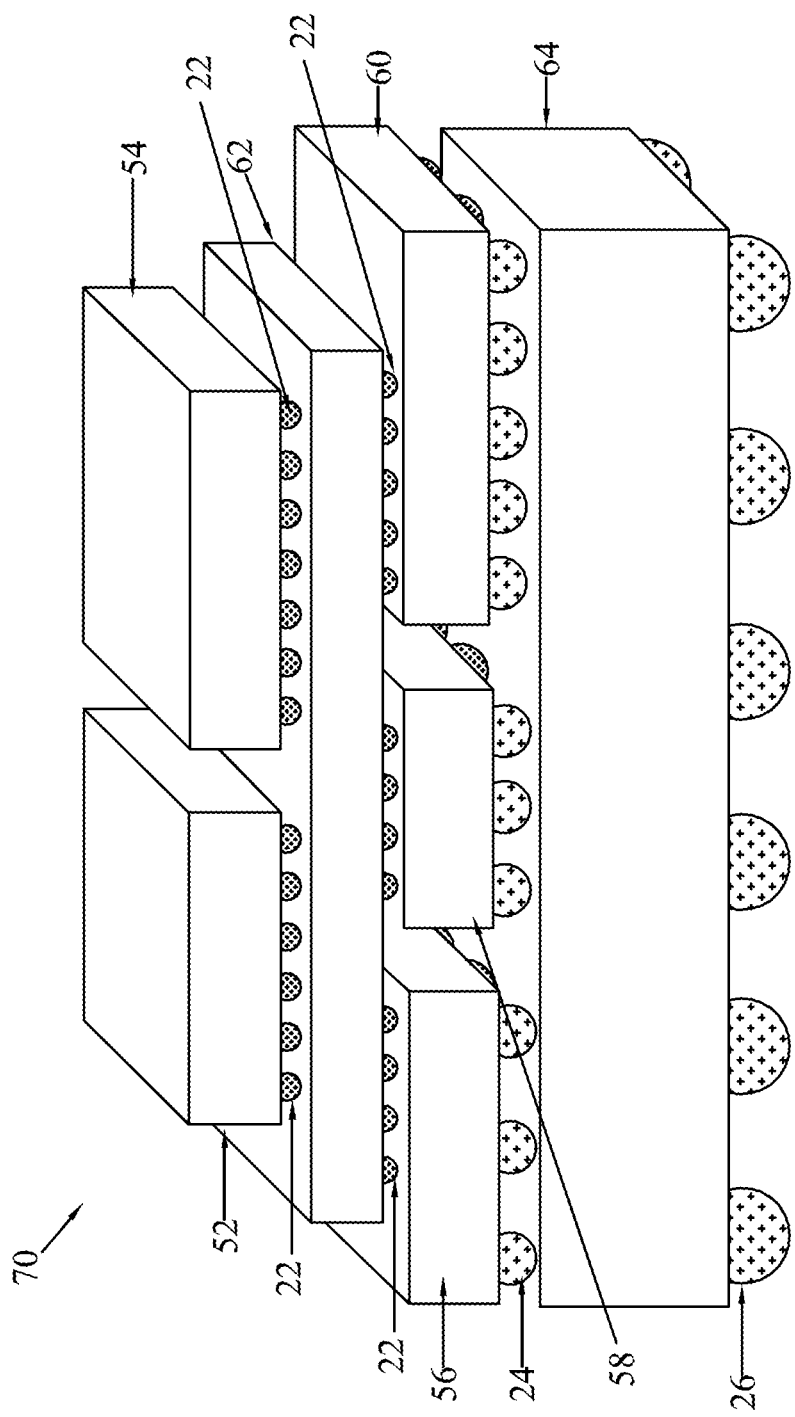
FIG. 4 illustrates a three-dimensional view of the 3DIC structure depicted in cross-section in FIG. 3.

FIG. 4 illustrates a three-dimensional view of the 3DIC structure 70 depicted in cross-section in FIG. 3. It is worth noting that, as stated above, one or more bond wires may be connected to each of one or more of the dies, such as discussed in FIG. 3, although not specifically illustrated in FIG. 4.

Figure 5:
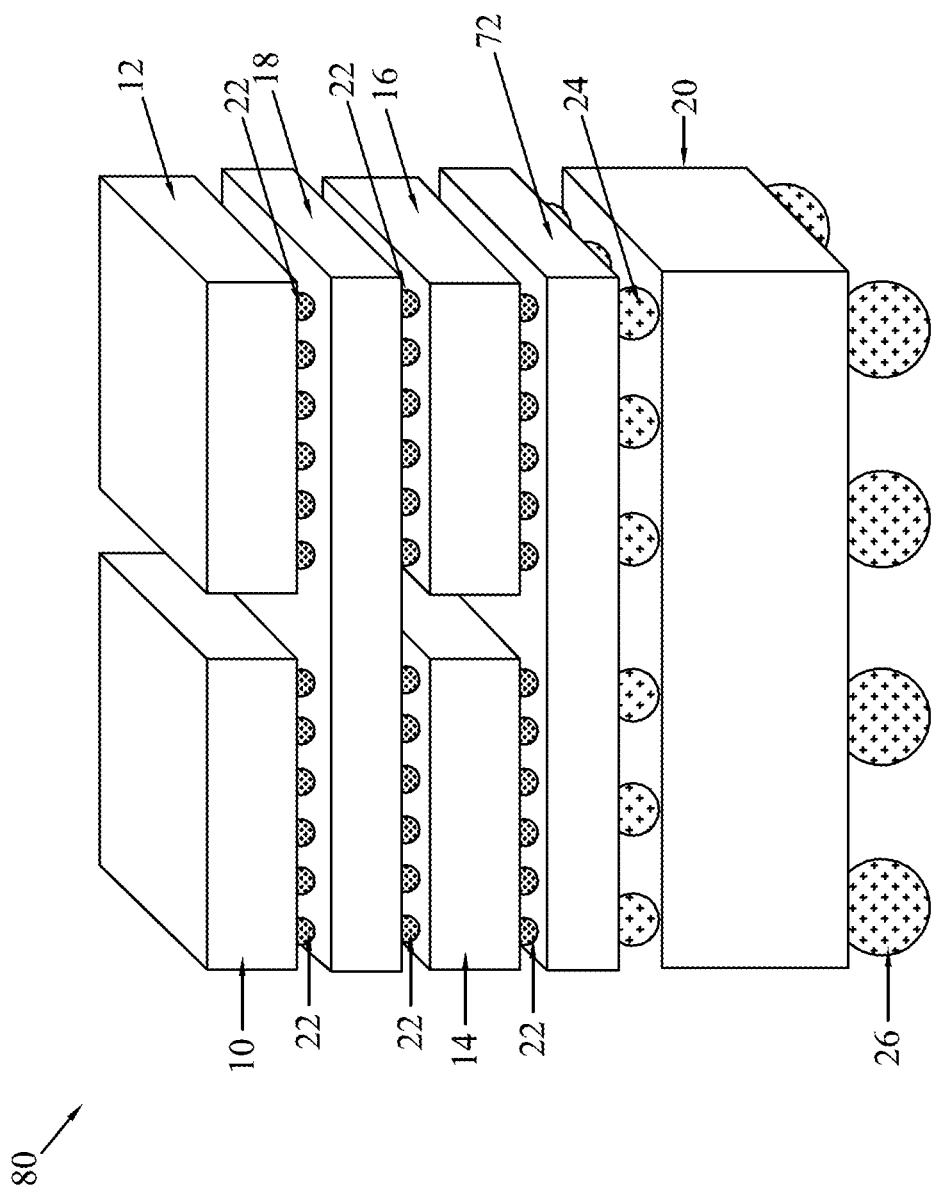
FIG. 5 is a three-dimensional view of a 3DIC structure with an underlying interposer according to an embodiment.

FIG. 5 is a three-dimensional view of a 3DIC structure 80 similar to the structure 50 in FIG. 1. The structure 80 includes a second interposer 72 between the first level dies 14/16 and the substrate 20. First connectors 22 electrically, communicatively, and/or mechanically couple the second surface of the first level dies to a first surface, such as a top surface, of the second interposer 72, and second connectors 24 electrically, communicatively, and/or mechanically couple a second surface, such as a top surface, of the interposer 72 to the substrate 20. The second interposer 72 is generally similar to the interposer 18 and may allow for additional electrical paths between dies.

Figure 6:
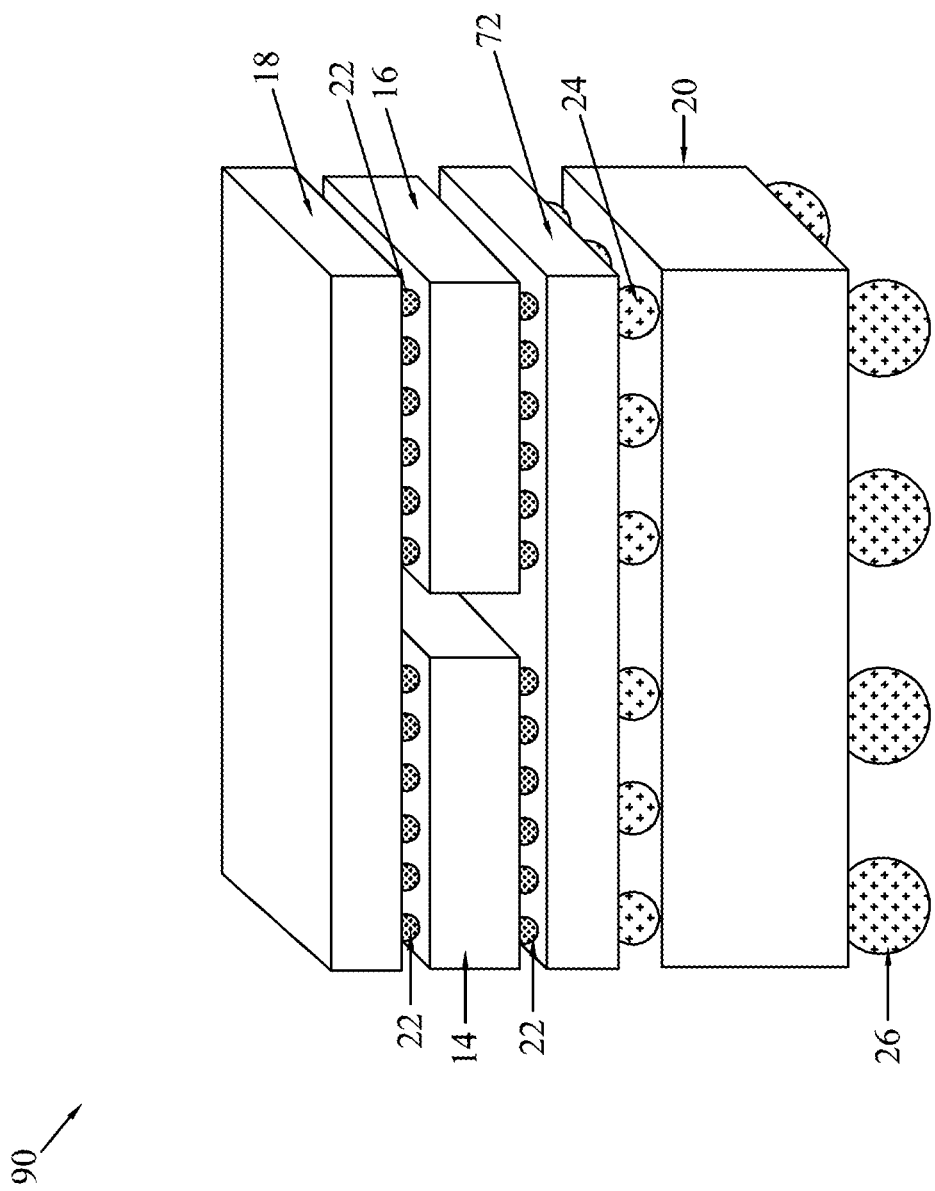
FIG. 6 is a three-dimensional view of a structure with a capping interposer according to an embodiment.

FIG. 6 is a three-dimensional view of a structure 90 similar to the 3DIC structure 80 in FIG. 5. The structure 80 does not include dies over the interposer 18. Thus, the interposer 18 may be a capping interposer.

Figure 7:
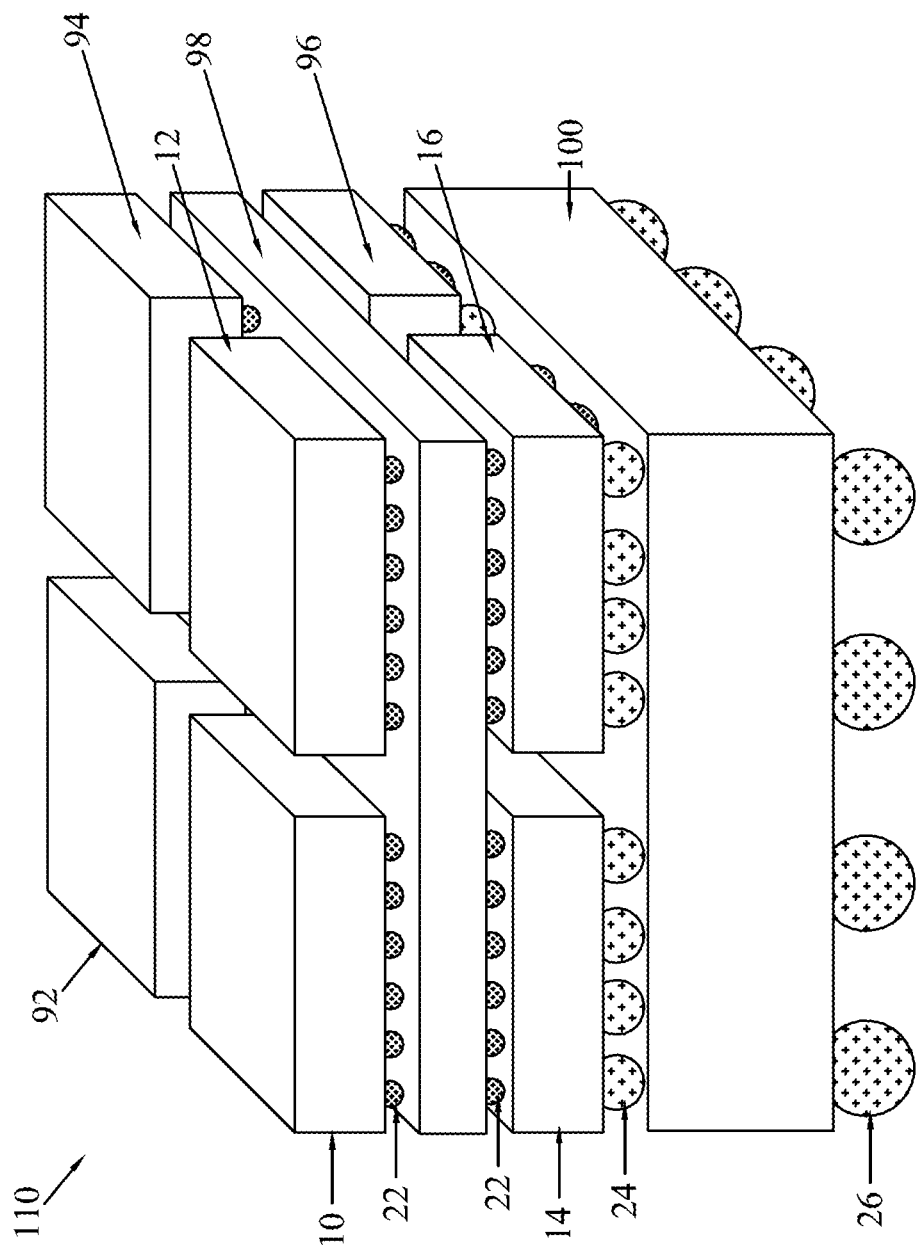
FIG. 7 is a three-dimensional view of an eight-die 3DIC structure according to an embodiment.

FIG. 7 illustrates a three-dimensional view of an eight-die 3DIC structure 110. The 3DIC structure 110 is similar to the 3DIC structure 50 in FIGS. 1 and 2. The 3DIC structure 110 further includes a fifth die 92 and a sixth die 94 on the second level on an interposer 98 and includes a seventh die (not specifically depicted) and an eighth die 96 on the first level on a substrate 100. The interposer 98 and the substrate 100 differ from the interposer 18 and the substrate 20, respectively, in that the interposer 98 and the substrate 100 can accommodate an area of four dies (an area of two dies-by-two dies) rather than of two dies. The 3DIC structure 110 may have features as discussed with regard to the 3DIC structure 50 of FIGS. 1 and 2. Further, embodiments contemplate additional features, such as different numbers of dies on different levels, different sizes of dies, different electrical couplings, etc., such as discussed with respect to FIGS. 3 and 4, and an underlying and a capping interposer, such as discussed with respect to FIGS. 5 and 6.

Figure 8:
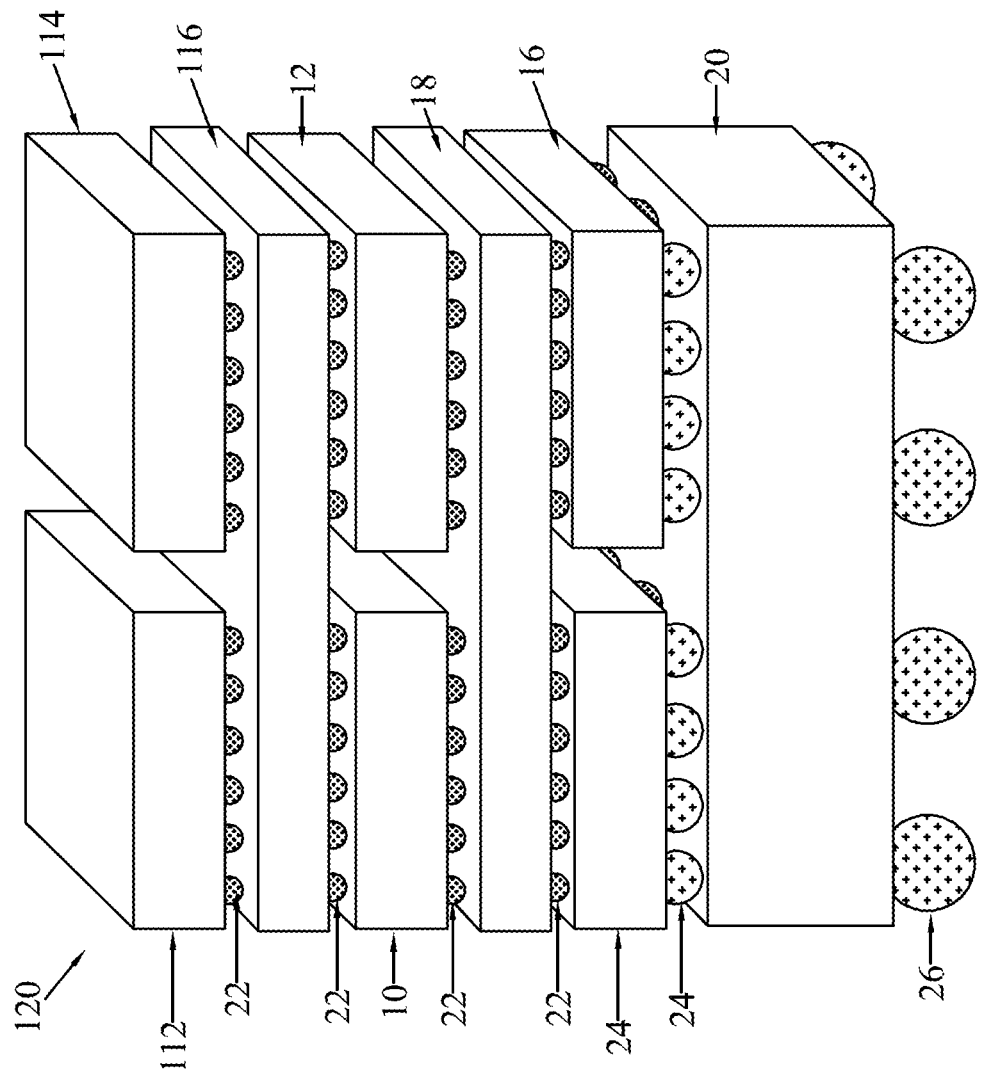
FIG. 8 is a three-dimensional view of a six-die 3DIC structure according to an embodiment.

FIG. 8 illustrates a three-dimensional view of a six-die 3DIC structure 120. The 3DIC structure 120 is similar to the 3DIC structure 50 in FIGS. 1 and 2. The 3DIC structure 120 further includes a fifth die 112 and a sixth die 114 (collectively "third level dies 112/114") on a third level on an interposer 116. The interposer 116 is on and coupled to the second level dies 10/12 by first connectors 22. In this embodiment, one or both of the second level dies includes TSVs to allow signals from the third level dies 112/114 to be passed to various underlying levels of the 3DIC structure 120. The 3DIC structure 120 may have features as discussed with regard to the 3DIC structure 50 of FIGS. 1 and 2. Further, embodiments contemplate additional features, such as different numbers of dies on different levels, different sizes of dies, different electrical couplings, etc., such as discussed with respect to FIGS. 3 and 4, and an underlying and a capping interposer, such as discussed with respect to FIGS. 5 and 6.

Figure 9:
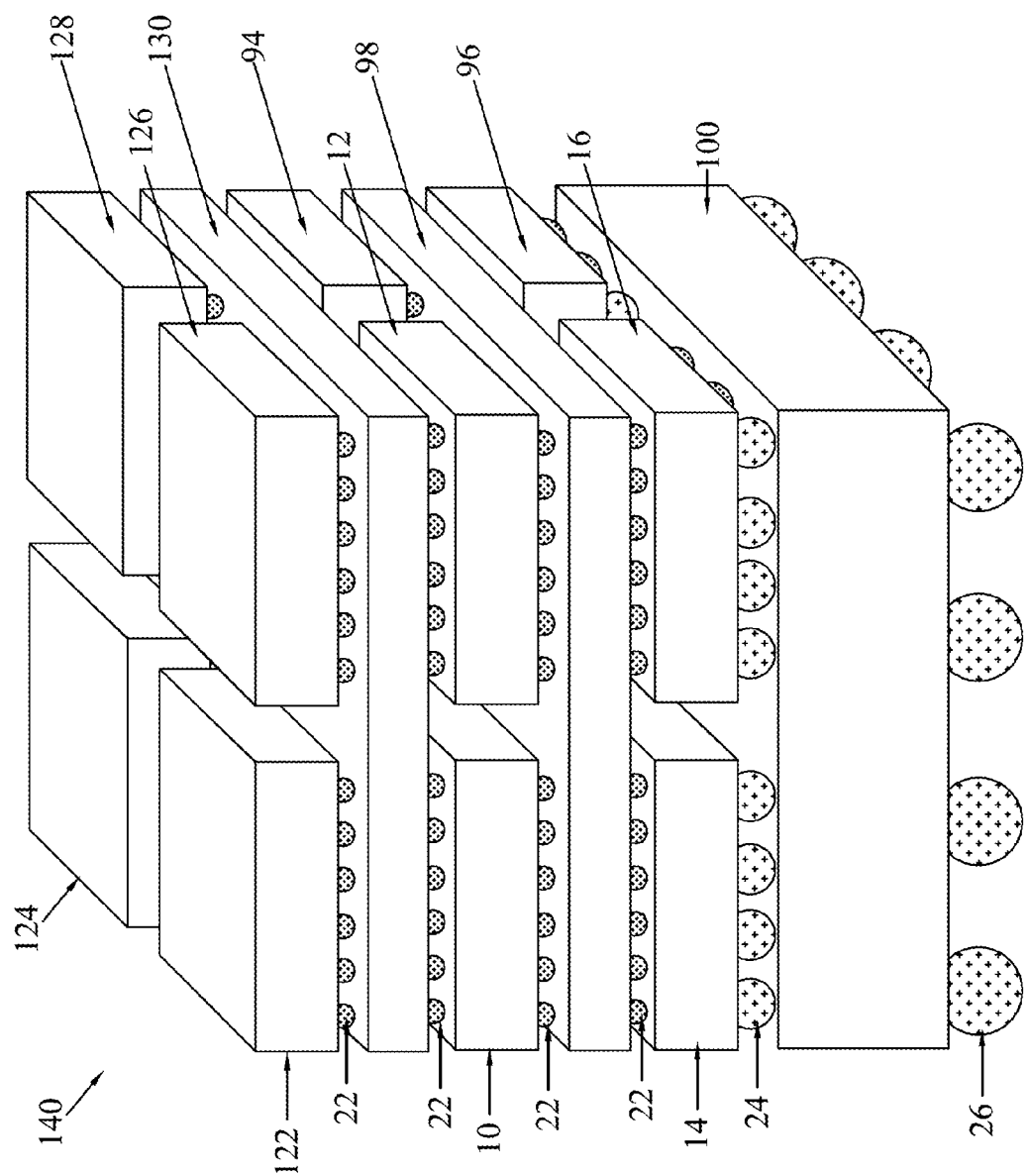
FIG. 9 is a three-dimensional view of a twelve-die 3DIC structure according to an embodiment.

FIG. 9 illustrates a three-dimensional view of a twelve-die 3DIC structure 140. The 3DIC structure 140 combines features of the 3DIC structure 110 of FIG. 7 and the 3DIC structure 120 of FIG. 8. The 3DIC structure 140 further comprises a ninth die 122, a tenth die 124, an eleventh die 126, and a twelfth die 128 on and coupled to an interposer 130 by first connectors 22. The interposer 130 is similar to the interposer 98 in that it can accommodate an area of four dies (an area of two dies-by-two dies). The 3DIC structure 140 may have features as discussed with regard to the 3DIC structure 50 of FIGS. 1 and 2. Further, embodiments contemplate additional features, such as different numbers of dies on different levels, different sizes of dies, different electrical couplings, etc., such as discussed with respect to FIGS. 3 and 4, and an underlying and a capping interposer, such as discussed with respect to FIGS. 5 and 6.

FIGS. 10A through 10M illustrate a method for forming a three level 3DIC structure, such as the 3DIC structure 120 of FIG. 8 and/or the 3DIC structure 140 of FIG. 9, according to an embodiment. A person having ordinary skill in the art will readily understand how to modify the process disclosed herein to achieve a two level 3DIC structure, a 3DIC structure having more than three levels, or a 2.5DIC structure. Further, the steps discussed may be performed in any logical order. These modifications are contemplated within the scope of various embodiments. For example, although some steps illustrate chip-on-wafer bonding, some steps may be performed using wafer-on-wafer bonding.

Figure 10A:
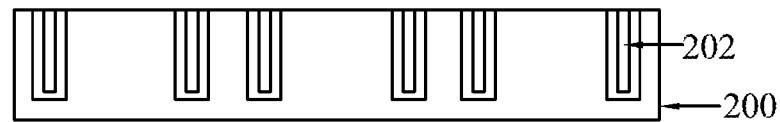
FIGS. 10A through 10M are a method for forming a three level 3DIC structure according to an embodiment.

Referring first to FIG. 10A, a first interposer substrate 200 is shown with TSVs 202 formed through a front side of the first interposer substrate 200. The first interposer substrate 200 generally comprises a material similar to the substrate used to form dies that will be attached to the interposer, such as silicon. While the first interposer substrate 200 may be formed of other materials, it is believed that using silicon substrates for the interposer may reduce stress because the coefficient of thermal expansion (CTE) mismatch between the silicon substrates and the silicon typically used for the dies is lower than with substrates formed of different materials.

The TSVs 202 are formed by forming recesses in the first interposer substrate 200 by, for example, etching, milling, laser techniques, a combination thereof, and/or the like. A thin barrier layer is conformally deposited over the front side of the first interposer substrate 200 and in the openings, such as by chemical vapor deposition (CVD), atomic layer deposition (ALD), physical vapor deposition (PVD), thermal oxidation, a combination thereof, and/or the like. The barrier layer may comprise a nitride or an oxynitride, such as titanium nitride, titanium oxynitride, tantalum nitride, tantalum oxynitride, tungsten nitride, a combination thereof, and/or the like. A conductive material is deposited over the thin barrier layer and in the openings. The conductive material may be formed by an electro-chemical plating process, CVD, ALD, PVD, a combination thereof, and/or the like. Examples of conductive materials are copper, tungsten, aluminum, silver, gold, a combination thereof, such as alloys, and/or the like. Excess conductive material and barrier layer is removed from the front side of the first interposer substrate 200 by, for example, chemical mechanical polishing. Thus, the TSVs 202 comprise a conductive material and a thin barrier layer between the conductive material and the first interposer substrate 200. The thin barrier layer may be omitted, for example, when the first interposer substrate 200 is an insulator material.

Figure 10B:
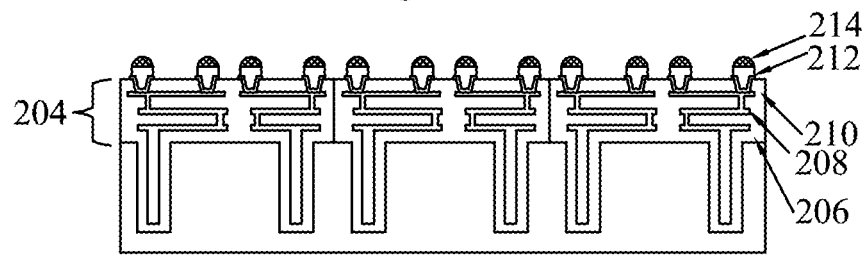

Front side processing continues in FIG. 10B with the formation of an interconnect structure 204 on the first interposer substrate 200. The interconnect structure 204 may comprise any number or combination of metallization layers, inter-metal dielectric (IMD) layers, vias, and passivation layers. The interconnect structure 204 depicted in FIG. 10B comprises three metallization layers, such as a first metallization layer (Mx) 206, a second metallization layer (My) 208, and a third metallization layer (Mz) 210, in IMD layers (connections depicted in metallization layers in the figures not intended to implicate specific connections). Vias are formed between metallization layers in the IMD layers. The metallization layers are formed by depositing an IMD layer, etching the metallization pattern of the layer in the IMD layer using, for example, acceptable photolithography techniques, depositing a conductive material for the metallization in the IMD, and removing any excess conductive material by, for example, CMP. The photolithography technique may include a single damascene process or a dual damascene process, particularly when vias are formed through an IMD to an underlying metallization layer.

The IMD layers can be an oxide dielectric, such as a silicon dioxide ($SiO_2$), borophosphosilicate glass (BPSG), SiLK from Dow Chemicals, Teflon AF, or other dielectric material. The conductive material of the metallization layers may be, for example, copper, nickel, aluminum, copper aluminum, tungsten, titanium, gold, silver combinations thereof, such as alloys, and/or the like. The metallization layers may include barrier layers between the conductive material and the IMD material, and other dielectric layers, such as etch stop layers made of, for example, silicon nitride, may be formed between the IMD layers.

After the formation of the top metallization layer, the third metallization layer 210 in FIG. 10B, one or more passivation layers are formed over the metallization layers. The passivation layer(s) may be a polyimide, a BPSG, silicon nitride (SiN), a combination thereof, and/or the like, and may be formed using a spin-on technique, CVD, ALD, PVD, a combination thereof, and/or the like. Openings are formed through the passivation layers to expose the top metallization layer, the third metallization layer 210 in FIG. 10B, for the formation of connector pads 212 on the top metallization layer. The openings may be formed using, for example, acceptable photolithography and etching techniques.

Connector pads 212 are formed through the openings on the top metallization layer, and conductive connectors 214 are formed on the connector pads 212. The conductive connectors 214 are, for example, pins, micro-bumps, bumps, micro-pillars, pillars, columns, the like, and/or a combination thereof. The connector pads 212 may be formed by depositing a conductive material in the openings and patterning the conductive material into the connector pads 212. The conductive material may comprise copper, silver, tin, titanium, tungsten, gold silver, a combination thereof, such as alloys, and/or the like, and may be deposited by PVD, CVD, ALD, a combination thereof, and/or the like. The patterning of the connector pads 212 may be by acceptable photolithography and etching techniques. The conductive connectors 214 are formed on the connector pads 212 by electrochemical plating (ECP) and/or the like, and may comprise copper, tin, nickel, a combination thereof, and/or the like.

Figure 10C:
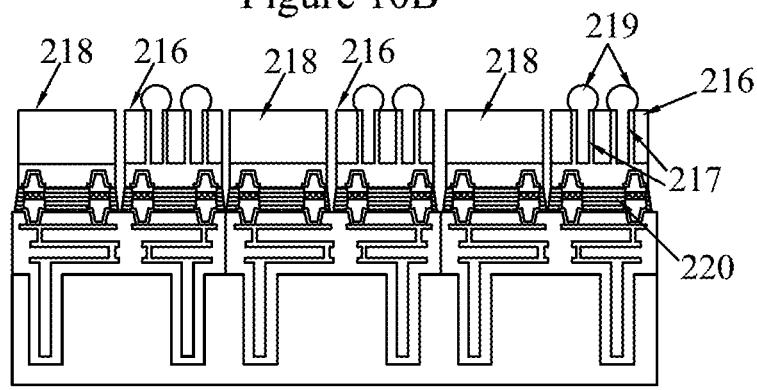

In FIG. 10C, first dies 216 and second dies 218 (collectively "third level dies 216/218") (and more dies if more are to be used) are attached by the conductive connectors 214, and an underfill material 220 is dispensed between the third level dies 216/218 and the first interposer substrate 200. The third level dies 216/218 may be known good dies attached using a pick-and-place tool, and the conductive connectors 214 may be reflowed before the underfill material 220 is dispensed. The underfill material 220 may be a liquid epoxy, deformable gel, silicon rubber, a combination thereof, and/or the like dispensed using acceptable dispensing equipment.

Further, the first dies 216 each comprise TSVs 217 coupled to conductive connectors 219, which are, for example, C4 bumps. The TSVs 217 may be formed before active or passive devices in each of the first dies 216 are formed and before each of the first dies 216 is singulated from a wafer. While part of the wafer, the TSVs 217 may be formed by forming an opening through a surface of the first die substrates, such as by etching, milling, laser techniques, a combination thereof, and/or the like. A thin barrier layer is conformally deposited over the first die substrates and in the openings, such as by CVD, ALD, PVD, thermal oxidation, a combination thereof, and/or the like. The barrier layer may comprise a nitride or an oxynitride, such as titanium nitride, titanium oxynitride, tantalum nitride, tantalum oxynitride, tungsten nitride, a combination thereof, and/or the like. A conductive material is deposited over the thin barrier layer and in the openings. The conductive material may be formed by an electro-chemical plating process, CVD, ALD, PVD, a combination thereof, and/or the like. Examples of conductive materials are copper, tungsten, aluminum, silver, gold, a combination thereof, and/or the like. Excess conductive material and barrier layer is removed from the first die substrate by, for example, chemical mechanical polishing. Thus, the TSVs 217 comprise a conductive material and a thin barrier layer between the conductive material and the first die substrate.

The wafer of the first dies 216 is then thinned from the backside to expose the TSVs 217, such as by a chemical mechanical polishing (CMP) process. The wafer may be attached to a carrier substrate to provide support during the thinning. A passivation layer is formed on the backside, and the TSVs 217 are exposed through the passivation layer, for example, by etching using acceptable photolithography techniques. Connector pads may be formed on the exposed TSVs 217 by depositing and patterning a conductive material. Conductive connectors 219 are then formed on the connector pads. The wafer is then diced to singulate the first dies 216, and the first dies 216 are attached to the first interposer substrate 200 by the conductive connectors 214. It is worth noting that the backside processing of the first dies 216 may be performed before attachment to the first interposer substrate 200 or in part or in whole after attachment to the first interposer substrate 200. A person having ordinary skill in the art will readily understand these modifications, and thus, discussion of these modifications are omitted herein for brevity.

Figure 10D:
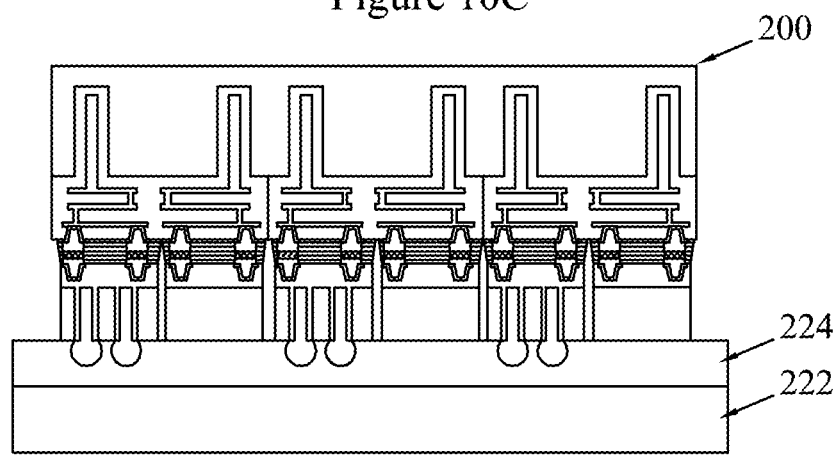

Back side processing of the first interposer substrate 200 is depicted as beginning in FIG. 10D. The assembly of FIG. 10C is attached to a first carrier substrate 222 during the back side processing. The first carrier substrate 222 may be attached to the third level dies 216/128 using an adhesive 224. Generally, the first carrier substrate 222 provides temporary mechanical and structural support during subsequent processing steps. The first carrier substrate 222 may comprise, for example, glass, silicon oxide, aluminum oxide, a combination thereof, and/or the like. The adhesive 224 may be any suitable adhesive, such as ultraviolet (UV) glue, which loses its adhesive property when exposed to UV lights.

Figure 10E:
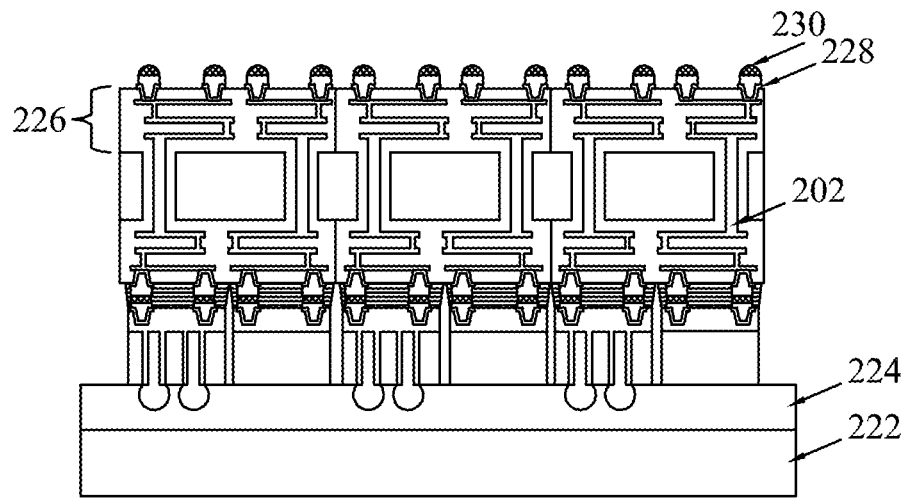

In FIG. 10E, the TSVs 202 are exposed from the back side of the first interposer substrate 200 by thinning the first interposer substrate 200. The thinning process may be performed using an etching process and/or a planarization process, such as a CMP process. An interconnect structure 226 is formed on the back side of the first interposer substrate 200. Similar to the interconnect structure 204 on the front side, the interconnect structure 226 may comprise any number or combination of metallization layers, IMD layers, vias, and passivation layers. The interconnect structure 226 comprises three metallization layers in IMD layers. Vias are formed between metallization layers in the IMD layers. After the formation of the top metallization layer, one or more passivation layers are formed over the metallization layers. Openings are formed through the passivation layers to expose the top metallization layer. Connector pads 228 are formed through the openings on the top metallization layer, and conductive connectors 230 are formed on the connector pads 228. Components formed during the backside processing discussed with respect to FIG. 10E may comprise any of the materials and be formed by any of the techniques discussed for corresponding components formed during front side processing, such as discussed with respect to FIG. 10B.

Figure 10F:
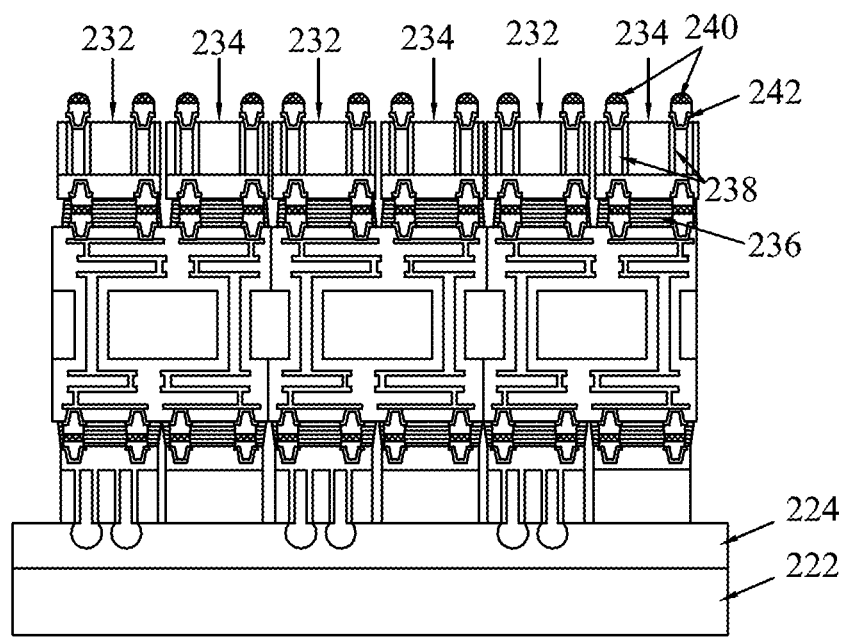

In FIG. 10F, third dies 232 and fourth dies 234 (collectively "second level dies 232/234") (and more dies if more are to be used) are attached by the conductive connectors 230, and an underfill material 236 is dispensed between the second level dies 232/234 and the first interposer substrate 200. The second level dies 232/234 may be known good dies attached using a pick-and-place tool, and the conductive connectors 230 may be reflowed before the underfill material 236 is dispensed. The underfill material 236 may be a liquid epoxy, deformable gel, silicon rubber, a combination thereof, and/or the like dispensed using acceptable dispensing equipment.

Further, the second level dies 232/234 each comprise TSVs 238 coupled to conductive connectors 240. The processing of the TSVs 238 in the second level dies 232/234 may be by the same or similar techniques and with the same or similar materials as the TSVs 217 in the first dies 216, such as discussed with respect to FIG. 10C. Further, conductive connectors 240 may be formed on connector pads 242. The conductive connectors 240 are, for example, pins, micro-bumps, bumps, micro-pillars, pillars, columns, the like, and/or a combination thereof. After thinning the respective wafers to expose the TSVs 238, depositing a passivation layer, and exposing the TSVs 238 through the passivation layer, the connector pads 242 may be formed by depositing a conductive material on the backside of the second level dies 232/234, such as on a backside of respective wafers before the dies are singulated, and by patterning the conductive material by acceptable lithography techniques. The conductive material may comprise copper, silver, tin, titanium, tungsten, a combination thereof, and/or the like, and may be deposited by PVD, CVD, ALD, a combination thereof, and/or the like. The conductive connectors 240 are formed on the connector pads 242 by electrochemical plating (ECP), and/or the like, and may comprise copper, tin, nickel, a combination thereof, and/or the like. It is worth noting that the backside processing of the second level dies 232/234 may be performed before attachment to the first interposer substrate 200 or in part or in whole after attachment to the first interposer substrate 200.

Figure 10G:
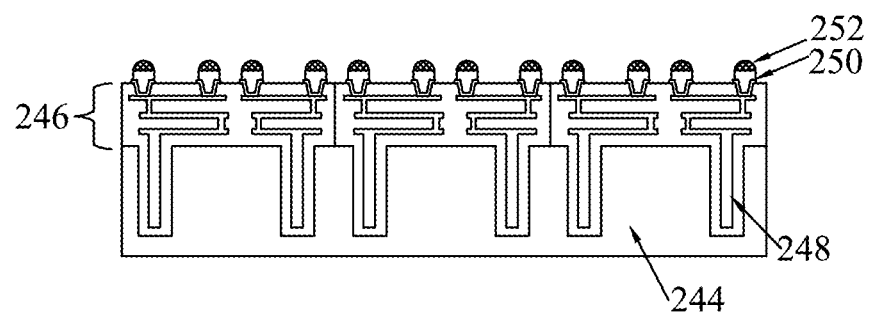

In FIG. 10G, a second interposer substrate 244 is processed through front side processing as discussed with respect to FIGS. 10A and 10B. The second interposer substrate 244 includes a front side interconnect structure 246 comprising metallization layers, IMD layers, vias, and also includes connector pads 250 and conductive connectors 252. The second interposer substrate 244 also includes TSVs 248. The front side processing of the second interposer substrate 244 is performed the same as or similar to the process discussed with respect to FIGS. 10A through 10B.

Figure 10H:
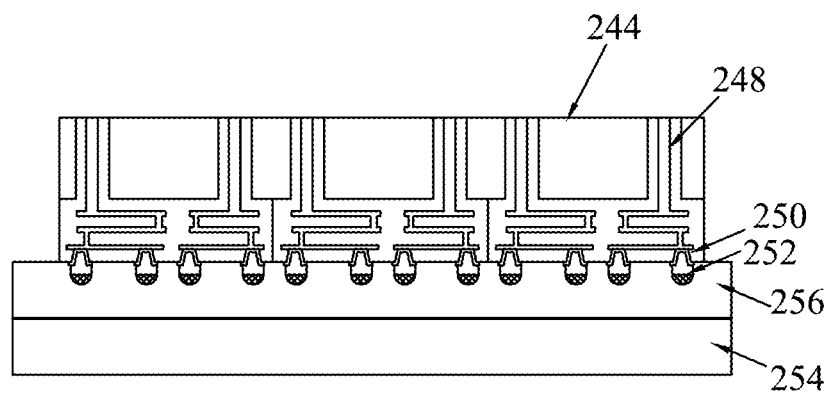

Back side processing of the second interposer substrate 244 is depicted as beginning in FIG. 10H. The assembly of FIG. 10G is attached to a second carrier substrate 254 during the back side processing. The second carrier substrate 254 may be attached to the front side of the second interposer substrate 244, comprising the conductive connectors 252, using an adhesive 256. These components are similar to those discussed with regard to FIG. 10D. The TSVs 248 are exposed from the back side of the second interposer substrate 244 by thinning the second interposer substrate 244. The thinning process may be performed using an etching process and/or a planarization process, such as a CMP process.

Figure 10I:
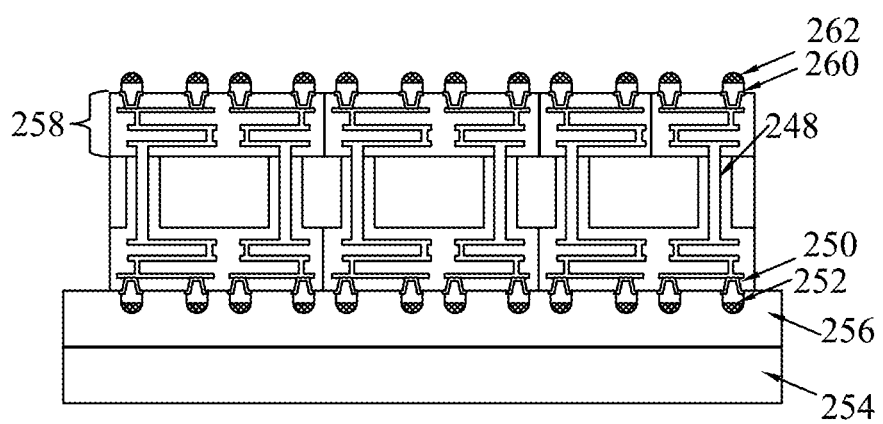

In FIG. 10I, similar to FIG. 10E, an interconnect structure 258 is formed on the back side of the second interposer substrate 244. Similar to the interconnect structure 246 on the front side, the interconnect structure 258 may comprise any number or combination of metallization layers, IMD layers, vias, and passivation layers. The interconnect structure 258 comprises three metallization layers in IMD layers. Vias are formed between metallization layers in the IMD layers. After the formation of the top metallization layer, one or more passivation layers are formed over the metallization layers. Openings are formed through the passivation layers to expose the top metallization layer. Connector pads 260 are formed through the openings on the top metallization layer, and conductive connectors 262 are formed on the connector pads 260. Components formed during the backside processing discussed with respect to FIGS. 10H and 10I may comprise any of the materials and be formed by any of the techniques discussed for corresponding components formed during front side processing, such as discussed with respect to FIG. 10E.

Figure 10J:
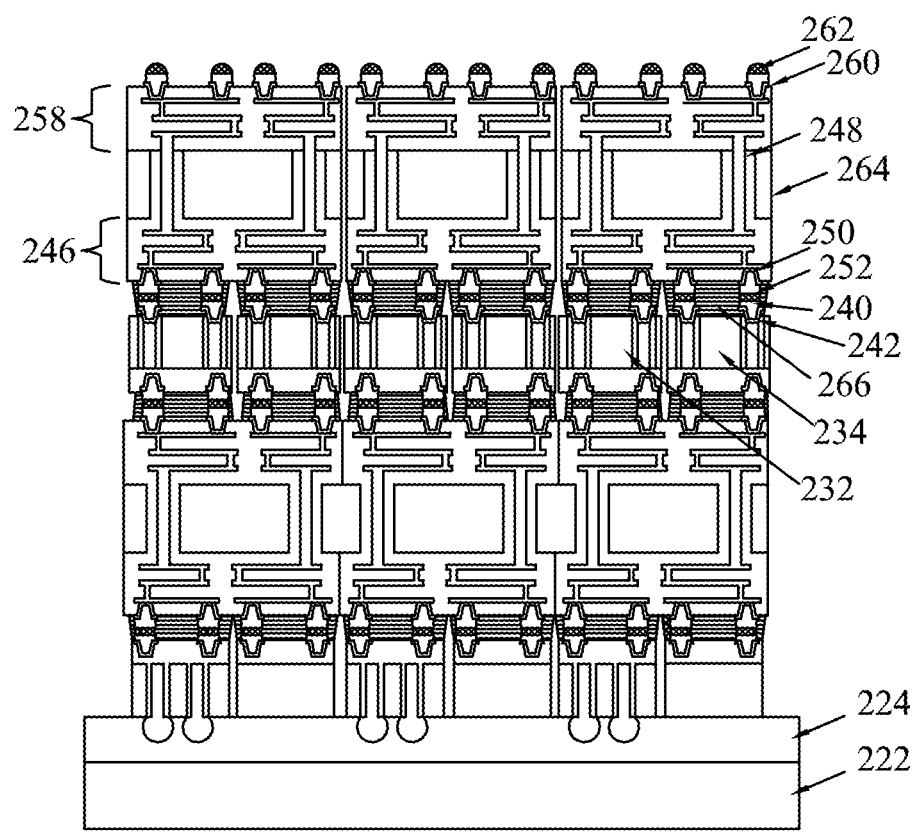

In FIG. 10J, the second interposer substrate 244 is singulated to form individual second interposers 264, and the second interposers 264 are detached from the carrier substrate 254 by, for example, exposing the adhesive 256 to UV radiation. The second interposers 264 are on and coupled to the second level dies 232/234 by the conductive connectors 240 and 252 on the connector pads 242 and 250. The second interposers 264 are attached using, for example, a pick-and-place tool and reflowing the conductive connectors 240 and 252. An underfill material 266 is dispensed between the second interposers 264 and the second level dies 232/234. The underfill material 266 may be a liquid epoxy, deformable gel, silicon rubber, a combination thereof, and/or the like dispensed using acceptable dispensing equipment.

Figure 10K:
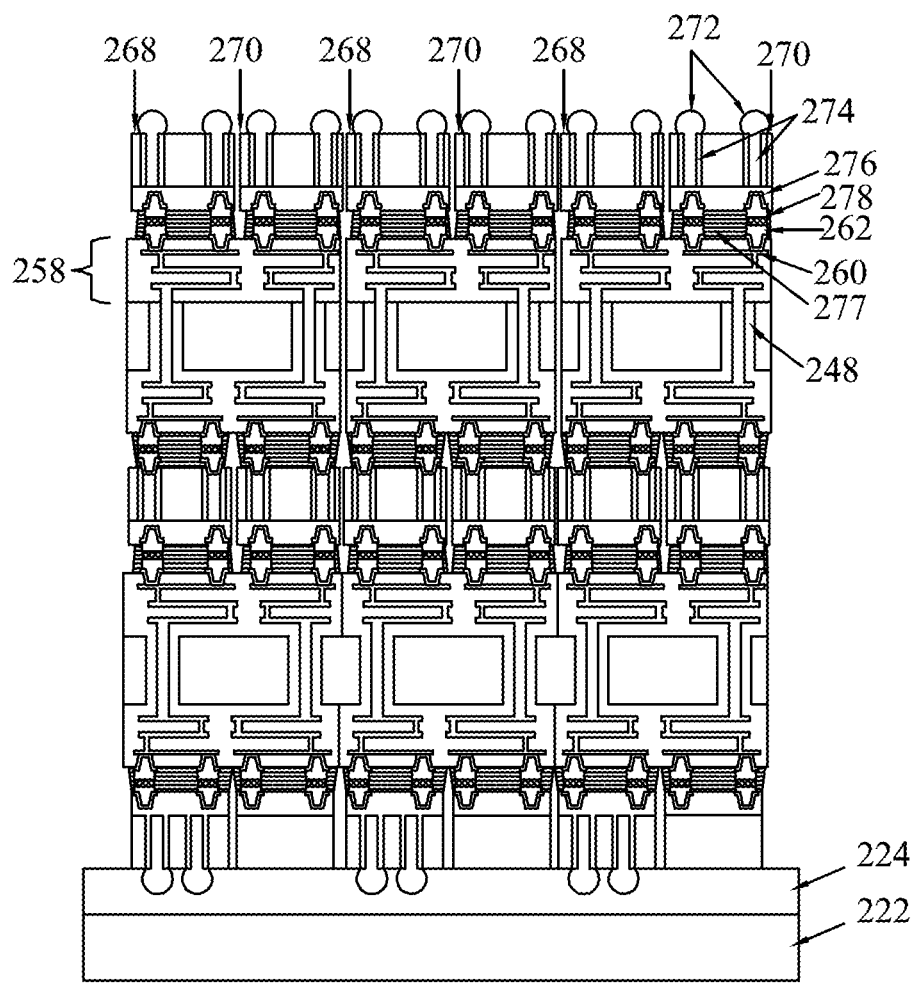

In FIG. 10K, fifth dies 268 and sixth dies 270 (collectively "first level dies 268/270") (and more dies if more are to be used) are attached by the conductive connectors 278 on bond pads 276 of the first level dies 268/270 and by conductive connectors 262, and the connectors 278 and 262 are reflowed. The first level dies 268/270 may be known good dies attached using a pick-and-place tool. An underfill material 277 is dispensed between the first level dies 268/270 and the second interposer 264. The underfill material 277 may be a liquid epoxy, deformable gel, silicon rubber, a combination thereof, and/or the like dispensed using acceptable dispensing equipment.

Further, the first level dies 268/270 each comprise TSVs 274 coupled to conductive connectors 272, which are, for example, C4 bumps. The processing of the TSVs 274 in the first level dies 268/270 may be by the same or similar techniques and with the same or similar materials as the TSVs 238 in second level dies 232/234, such as discussed with respect to FIG. 10F. After thinning the respective wafers to expose the TSVs 274, depositing a passivation layer, and exposing the TSVs 274 through the passivation layer, the connector pads may be formed on the exposed TSVs 274 by depositing and patterning a conductive material. Conductive connectors 272 are then formed on the connector pads. Each of the first level dies 268/270 is then singulated, and first level dies 268/270 are attached to the second interposer substrate 244 by the conductive connectors 168. It is worth noting that the backside processing of the first level dies 268/270 may be performed before attachment to the second interposer substrate 244 or in part or in whole after attachment to the second interposer substrate 244.

Figure 10L:
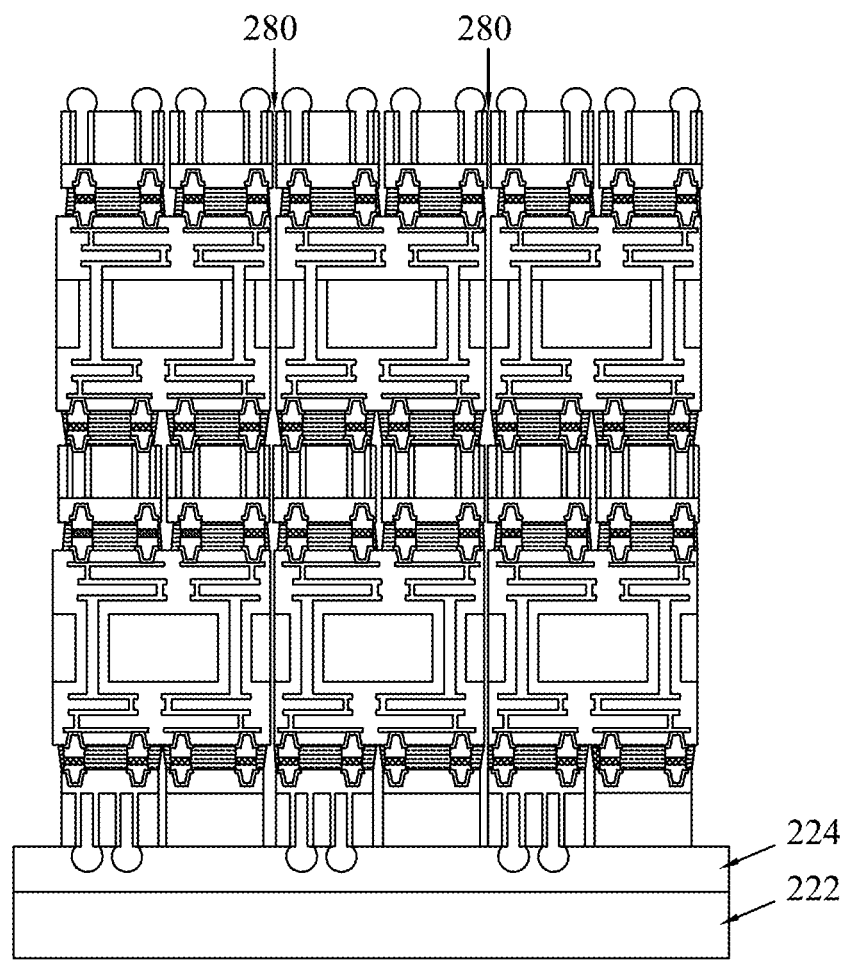
Figure 10M:
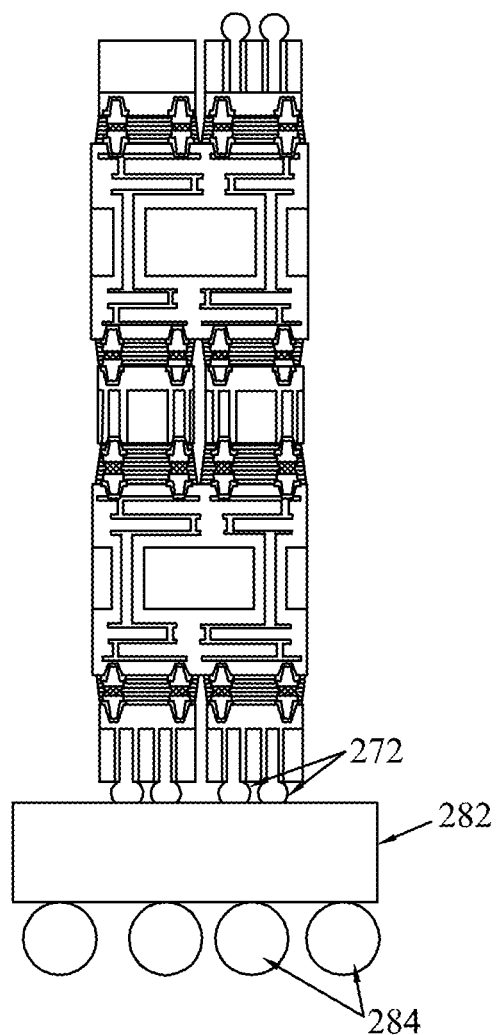

In FIG. 10L, the first interposer substrate 200 is diced in dice lines 280 to singulate individual 3DIC structures. The dicing may be performed by a dicing saw, an etch, the like, or a combination thereof. The singulated 3DIC structures are then coupled to a first surface of a substrate 282 by the conductive connectors 272. The substrate 282 may be a package laminate substrate. The substrate 282 has conductive balls 284, such as BGA balls on a second surface. Additional packaging steps may be performed on the 3DIC structure, such as encapsulating with a molding compound. These steps are readily apparent to a person having ordinary skill in the art, and accordingly, these steps are omitted for brevity.

Embodiments may achieve various advantages. First, higher connectivity between dies may be achieved without dependency upon the design of another die. For example, two dies may be electrically coupled through an interposer without the need to use a TSV and/or metal line of a third die. Further, connectors on the interposer, such as micro-bumps, do not have to align with other connectors on the interposer because the interposer allows for redistribution of various connectors. Hence, asymmetrical routes may not be problematic in various embodiments. Next, die redundancy may be achieved to increase the yield of the manufactured 3DIC structures. For example, a redundant die can functionally take the place of another faulty die so that the 3DIC structure remains functional. Also, embodiments allow for a higher area for connectors, such as C4 bumps, to couple a package substrate compared to some prior art configurations where insufficient area is problematic. Also, a stacking height of the structures may be decreased. However, embodiments allow for a smaller footprint than other prior art configurations where the structure required too much area.

Even further, embodiments may achieve better voltage and thermal characteristics. In embodiments, power supplies of each die may not be serially connected. Serially connected power supplies in conventional structures would cause a significant voltage drop between the power source and the last die in the serial connection because of a relatively large current flow, particularly at the beginning of the serial connection, and the resistance of the conductors. Embodiments allow power supplies to be separated, thus allowing for reduced current flows, and reduced resistances from shorter distances for the current to flow. Thus, the voltage drop from power supplies may be reduced. Also, embodiments may achieve a shorter 3DIC structure height that may allow for a mix of lower die temperatures and increased heat production and dissipation. Shorter heights allow for shorter distances from some of the dies to a heat sink, reducing the thermal resistance and intervening die(s) heat production to flow through the thermal resistance. Temperature rise is generally the product of the thermal resistance and the to-be-dissipated heat per unit of time.

A first embodiment is a structure comprising a first die, a second die, a first interposer, a third die, and a fourth die. The first die has a first surface and a second surface, and the second surface of the first die is opposite the first surface of the first die. Respective ones of first conductive connectors are coupled to the first surface of the first die, and respective ones of second conductive connectors are coupled to the second surface of the first die. The second die has a first surface and a second surface, and the second surface of the second die is opposite the first surface of the second die. Respective ones of the first conductive connectors are coupled to the first surface of the second die, and respective ones of the second conductive connectors are coupled to the second surface of the second die. The first interposer is over the first die and the second die. A first surface of the first interposer is coupled to the first conductive connectors, and a second surface of the first interposer is coupled to third conductive connectors. The third die is over the first interposer, and a first surface of the third die is coupled to respective ones of the third conductive connectors. The fourth die is over the first interposer, and a first surface of the fourth die is coupled to respective ones of the third conductive connectors. The first die is communicatively coupled to the second die through the first interposer, and/or the third die is communicatively coupled to the fourth die through the first interposer.

A second embodiment is a structure comprising a first die level, a second die level, and a first interposer disposed between the first die level and the second die level. The first die level comprises a first die and a second die. Respective first surfaces of the first die and the second die are coupled to respective ones of first conductive connectors, and respective second surfaces of the first die and the second die are coupled to respective ones of second conductive connectors. The first surface of the first die is opposite the second surface of the first die, and the first surface of the second die is opposite the second surface of the second die. The second die level comprises a third die and a fourth die. Respective first surfaces of the third die and the fourth die are coupled to respective ones of third conductive connectors. A first surface of the first interposer is coupled to the first conductive connectors, and a second surface of the first interposer is coupled to the third conductive connectors.

A further embodiment is method comprising attaching a first die and a second die to a first surface of a first interposer using respective ones of first conductive connectors coupled to respective first surfaces of the first die and the second die; attaching a third die and a fourth die to a second surface of the first interposer using respective ones of second conductive connectors, the second surface of the first interposer being opposite the first surface of the interposer; and attaching the first die and the second die to a substrate using respective ones of third conductive connectors coupled to respective second surfaces of the first die and the second die.

A yet further embodiment is a method. A first die and a second die are attached to a first surface of an interposer using respective ones of first conductive connectors coupled to respective first surfaces of the first die and the second die. A third die and a fourth die are attached to a second surface of the interposer using respective ones of second conductive connectors coupled to respective first surfaces of the third die and the fourth die. The second surface of the interposer is opposite the first surface of the interposer. At least one of the first die, the second die, the third die, or the fourth die is a redundant die of another one of the first die, the second die, the third die, or the fourth die.

An even further embodiment is a method. A first die and a second die are attached to a first surface of an interposer using respective ones of first conductive connectors coupled to respective first surfaces of the first die and the second die. A third die and a fourth die are attached to a second surface of the interposer using respective ones of second conductive connectors coupled to respective first surfaces of the third die and the fourth die. The second surface of the interposer is opposite the first surface of the interposer. The first die and the second die are attached to a substrate using respective ones of third conductive connectors coupled to respective second surfaces of the first die and the second die. A wire is attached to a first conductive feature coupled to a second surface of the third die. The second surface of the third die is opposite from the first surface of the third die. The wire is attached to a second conductive feature on (i) the substrate, (ii) the second surface of the interposer, and/or (iii) the first surface of the first die.

Although the present embodiments and their advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method comprising:
    attaching a first die and a second die to a first surface of a first interposer using respective ones of first conductive connectors coupled to respective first surfaces of the first die and the second die;
    attaching a third die and a fourth die to a second surface of the first interposer using respective ones of second conductive connectors coupled to respective first surfaces of the third die and the fourth die, the second surface of the first interposer being opposite the first surface of the first interposer; and attaching the first die and the second die to a substrate using respective ones of third conductive connectors coupled to respective second surfaces of the first die and the second die, the respective second surfaces of the first die and the second die being opposite from the respective first surfaces of the first die and the second die.

2. The method of claim 1, wherein the first die is communicatively coupled to the second die through the first interposer, and/or the third die is communicatively coupled to the fourth die through the first interposer.

3. The method of claim 1, wherein the fourth die is not aligned with the first die in a direction orthogonal to the first surface of the first interposer, the first die being communicatively coupled to the fourth die by an electrical path, the electrical path not extending through the second die and the third die.

4. The method of claim 1, wherein a conductive feature is on a second surface of the third die, the second surface of the third die being opposite from the first surface of the third die.

5. The method of claim 1 further comprising attaching a wire to a conductive feature on a second surface of the third die, the second surface of the third die being opposite from the first surface of the third die, the wire being attached to the substrate.

6. The method of claim 1 further comprising attaching a wire to a conductive feature on a second surface of the third die, the second surface of the third die being opposite from the first surface of the third die, the wire being attached to the second surface of the first interposer.

7. The method of claim 1 further comprising attaching a wire to a first conductive feature on a second surface of the third die, the second surface of the third die being opposite from the first surface of the third die, the wire being attached to a second conductive feature coupled to the first surface of the first die.

8. The method of claim 1 further comprising attaching a wire to a first conductive feature on the first surface of the first die, the wire being attached to the second surface of the first interposer.

9. The method of claim 1 further comprising:
attaching a wire to a conductive feature on a second surface of the third die, the second surface of the third die being opposite from the first surface of the third die, the wire electrically coupling the third die with the first interposer, the first die, or the substrate; and
after attaching the wire, cutting the wire.

10. The method of claim 1, wherein the first interposer comprises a multiplexor.

11. The method of claim 10, wherein the multiplexor is capable of receiving respective signals from at least two of the first die, the second die, the third die, or the fourth die and selectively sending a selected signal.

12. The method of claim 1, wherein at least one of the first die, the second die, the third die, or the fourth die comprises a multiplexor capable of receiving respective signals from at least two others of the first die, the second die, the third die, or the fourth die.

13. The method of claim 1, wherein at least one of the first die, the second die, the third die, or the fourth die is a redundant die.

14. The method of claim 1 further comprising
attaching the third die and the fourth die to a first surface of a second interposer; and
attaching a fifth die and a sixth die to a second surface of the second interposer, the second surface of the second interposer being opposite from the first surface of the second interposer.

15. The method of claim 1 further comprising:
attaching a fifth die and a sixth die to the first surface of the first interposer; and
attaching a seventh die and an eighth die to the second surface of the first interposer.

16. A method comprising:
attaching a first die and a second die to a first surface of an interposer using respective ones of first conductive connectors coupled to respective first surfaces of the first die and the second die;
attaching a third die and a fourth die to a second surface of the interposer using respective ones of second conductive connectors coupled to respective first surfaces of the third die and the fourth die, the second surface of the interposer being opposite the first surface of the interposer, at least one of the first die, the second die, the third die, or the fourth die being a redundant die of another one of the first die, the second die, the third die, or the fourth die; and
attaching the first die and the second die to a substrate using respective ones of third conductive connectors coupled to respective second surfaces of the first die and the second die, the respective second surfaces of the first die and the second die being opposite from the respective first surfaces of the first die and the second die.

17. The method of claim 16, wherein at least one of the interposer, the first die, the second die, the third die, or the fourth die comprises a multiplexor capable of receiving respective signals from at least two others of the first die, the second die, the third die, or the fourth die.

18. A method comprising:
attaching a first die and a second die to a first surface of an interposer using respective ones of first conductive connectors coupled to respective first surfaces of the first die and the second die;
attaching a third die and a fourth die to a second surface of the interposer using respective ones of second conductive connectors coupled to respective first surfaces of the third die and the fourth die, the second surface of the interposer being opposite the first surface of the interposer;
attaching the first die and the second die to a substrate using respective ones of third conductive connectors coupled to respective second surfaces of the first die and the second die, the respective second surfaces of the first die and the second die being opposite from the respective first surfaces of the first die and the second die; and
attaching a wire to a first conductive feature coupled to a second surface of the third die, the second surface of the third die being opposite from the first surface of the third die, the wire being attached to a second conductive feature on (i) the substrate, (ii) the second surface of the interposer, and/or (iii) the first surface of the first die.

19. The method of claim 18 further comprising cutting the wire after attaching the wire, wherein the first conductive feature and the second conductive features are not electrically coupled after the cutting the wire.

* * * * *